United States Patent
Boedinger et al.

[19]

[11] Patent Number: 6,149,748
[45] Date of Patent: Nov. 21, 2000

[54] METHOD OF MANUFACTURING LARGE CRYSTAL BODIES

[75] Inventors: Hermann Boedinger; Thomas Berthold, both of Munich, Germany

[73] Assignee: Siemens Aktiengesellschaft, Munich, Germany

[21] Appl. No.: 09/132,547

[22] Filed: Aug. 11, 1998

[51] Int. Cl.[7] .......................... G01T 1/202; B32B 31/00
[52] U.S. Cl. .................... 156/89.11; 250/370.11; 264/1.21
[58] Field of Search .................. 156/245, 89, 89.11; 264/1.21, 1.7, 2.3, 2.4; 250/370.11

[56] References Cited

U.S. PATENT DOCUMENTS

| | | | |
|---|---|---|---|
| 3,898,463 | 8/1975 | Noakes | 250/367 |
| 3,933,970 | 1/1976 | Rosette et al. | 264/320 |
| 4,145,609 | 3/1979 | Takami et al. | 250/361 R |
| 4,465,546 | 8/1984 | Fitzpatrick et al. | 117/37 |
| 4,862,947 | 9/1989 | Horton et al. | 164/122.2 |
| 5,148,029 | 9/1992 | Persyk et al. | 250/361 R |
| 5,481,114 | 1/1996 | Daniel et al. | 250/390.11 |
| 5,506,408 | 4/1996 | Vickers et al. | 250/366 |
| 5,786,599 | 7/1998 | Rogers et al. | 250/483.1 |

FOREIGN PATENT DOCUMENTS 25 08 803  2/1975  Germany.

*Primary Examiner*—Francis J. Lorin
*Attorney, Agent, or Firm*—Hill & Simpson

[57] ABSTRACT

The invention proposes that a casting mold be provided with a lining for the manufacture of a crystal body. The lining is removed from the casting mold together with the crystal body that has solidified in the lining and the lining serves as a protective cap for the crystal body. Additional functional layers for the protective cap or the scintillator plate can be integrated into the lining.

23 Claims, 2 Drawing Sheets

METHOD OF MANUFACTURING LARGE CRYSTAL BODIES

FIELD OF THE INVENTION

The present invention relates generally to the manufacture of crystal bodies used in scintillator plates. More specifically, the present invention relates to methods of manufacturing large crystal bodies from a melt utilizing a casting mold.

BACKGROUND OF THE INVENTION

Scintillator plates of crystalline luminophores are utilized in radiation detectors such as, for example, in Anger cameras or in PET systems. The manufacture of such scintillator plates requires numerous steps. After the crystallization of the scintillator bodies, the plates must be cut into the required shape and ground on all sides. Subsequently, the scintillator bodies are optically coupled to a glass plate, behind which the luminescent light can then be measured with suitable photodetectors.

Since some of the luminophores are very moisture-sensitive and fracture-prone substances such as NaI or CsI, the other surfaces of the scintillator plates are protected against mechanical influences and against moisture. A cap, preferably of aluminum, serves this purpose. This cap can be provided with a layer at its inside surface for better reflection of the luminescent light. Laterally, the air gap between scintillator and cap is sealed with a rubber ring or the like to prevent the penetration of moisture. All of the above-referenced method steps must be implemented in special rooms with a moisture-free atmosphere in order to prevent harmful effects of moisture on the luminophore.

EP 0700454 discloses a casting process for manufacturing the crystal bodies for the scintillator plates wherein a melt flows into a cooled casting mold and solidifies therein. Stable melt vessels are required for the growth of halogenide crystals since the crucible walls are previously attacked by the melt given the presence of slight traces of water or hydroxide molecules. As a result thereof, the melt adheres firmly on the crucible walls after solidification. During cooling, the enormous tensile stresses occurring due to the thermal contraction of the melt can lead to the destruction of the crucible. Of course, this phenomena makes the process more expensive.

Therefore, there is a need to improve such methods or a similar methods for manufacturing crystal bodies to the effect that single-crystals having especially large diameters can be produced therewith in a more cost-beneficial and simplified way.

SUMMARY OF THE INVENTION

The present invention addresses the above referenced problems by providing a method of manufacturing large crystal bodies based on providing a lining for a casting mold, allowing the melt of a substance to solidify into a crystal body therein and to subsequently removing the crystal body together with the lining firmly joined thereto from the casting mold.

The present invention has the advantage that the adhesion of the crystal body to the lining is now no longer problematic but, quite to the contrary, is desired. Measures for preventing an adhesion of the solidified crystal body to the casting mold are no longer required. Nonetheless, the crystal body can be removed from the casting mold in a simple way, whereby there is no risk of breakage either for the crystal body or for the casting mold. Since only the lining comes into contact with the melt, only the lining has to be inert relative to the melt. With respect to selection of materials, the rest of the casting mold is therefore only limited to the required mechanical strength at the melt temperature. The crystal body, by contrast, is firmly joined to the lining at all sides, with the exception of the surface, and thus represents a protective cap for the crystal body. As a result, this is largely protected against mechanical damage and also against the influence of moisture, which is particularly advantageous given crystal bodies of the hygroscopic alkali halogenides. The protective cap also facilitates the further-processing of the crystal body since a number of protective measures and processing steps otherwise required are eliminated by the employment of a protective cap.

The material of the lining should be inert relative to the melt. The lining or, respectively, the protective cap preferably remains at the crystal body. In addition to the protection against mechanical damage and penetrating moisture, a protective cap or lining of light-reflecting material can be provided given a crystal body utilized as scintillator plate or, respectively, light-reflecting material can be built into the lining and, thus, into the protective cap. In this way, luminescent light generated in the scintillator can be scattered back by the protective cap, so that the luminescent light can be completely collected at the surface of the crystal body that is still free. For protection, this surface is also provided with a covering that, however, must be transmissive for the luminescent light. A glass plate is preferably employed therefor. Before the application of the glass plate, the crystal body is ground flat at the surface and, potentially, antireflection-coated. The application of the glass plate can ensue by gluing.

For introducing the reflective properties into the lining, the inside of the lining is provided with an additional reflection layer that has a high reflectivity for the luminescent light, a higher melting or decomposition point than the melt of the scintillator material and that also has chemical stability relative to the melt.

In particular, white pigments, for example aluminum oxide, titanium oxide or barium sulfate, are suitable for the reflection layer disposed on the inside surface of the lining. Powders or foils of suitable metals such as, for example, silver, platinum or iridium are likewise suitable.

A fine-grained powder with grain sizes below 0.1 mm is preferably employed for the reflection layer. This can be poured in, blown in or pressed in into the lining as loose powder. However, it is also possible to provide the reflective powder for the reflection layer with a bonding agent and to introduce it into the lining in the form of a paste or a slip. Carbon-free materials, for example silicate materials, particularly sodium water glass, are preferably utilized as bonding agent. Substances containing carbon are to be avoided, since, for example in the manufacture of alkali halogenide melts, they are reduced to carbon in the oxygen-depleted atmosphere required therefor, which can lead to the formation of black coatings and to the deterioration of the light reflection.

In a further development of the invention, the outside of the lining is provided with a further protective layer that forms the outside of the protective cap after the crystal body is removed from the casting mold. The protective layer serves as moisture block and/or for improving the mechanical stability and for preventing superficial damage to the crystal body. The protective layer is preferably composed of a metal or of an alloy that likewise exhibits a higher melting point than the scintillator material. In combination with a lining that is impermeable to vapor or melt of the scintillator material, the protective layer need not be inert to the melt. It can be introduced into the casting mold in the form of a foil. However, it is also possible to produce the protective layer in some other way, for example by vapor deposition or by deposition on the surface of the casting mold, by introduction in a pasty or powder-like form or with any other layer-generating process.

The lining can be single-layer or multi-layer. Each layer can thereby be individually introduced into the casting mold for producing the lining. However, it is also possible to produce a lining having the desired layer structure outside the casting mold, for example, a laminate or a potentially multiply coated foil.

The lining is preferably fitted into the casting mold with positive lock. To that end, it is brought into the desired exterior shape before being fitted to the casting mold. Given a flexible foil, for example given a potentially coated graphite foil, this can ensue by folding. Other shaping methods can be utilized given metallic foils, for instance a deep-drawing process. A shaping process for the lining implemented outside the casting mold can also start from an initial material that is present in particulate form, for example as flakes or grains. To this end, these are introduced into a mold in a single-layer or multi-layer loose fill and are subsequently compressed by pressing or rolling. As warranted, a bonding agent can thereby be added in order to assure a firm union in the lining. The compression is thereby preferably implemented in a separate tool. However, this is also possible directly in the casting mold.

The crystal body and the protective cap firmly joined thereto can be removed from the casting mold without damage to the surface of the crystal adjacent to the mold. A post-processing of the surface adjacent to the casting mold is therefore not necessary. In a development of the invention, the casting mold is utilized both for shaping the crystal body as well as for coining the surface. As a result of a corresponding fashioning of the inside wall of the casting mold, the surface of the protective cap and, potentially, of the crystal body as well can be provided with a pattern. This can be regular and serve for the production of a specific surface roughness. However, it is also possible to utilize this in imaging fashion and for the presentation of information. Alphanumerical characters that, for example, contain a serial number, use or safety instructions or the manufacturer's name can be unerasably transferred onto the protective cap or, respectively, to the crystal body.

In a development of the invention, a parting agent that reduces the friction and/or the adhesion is applied before the introduction of the lining into the casting mold. This prevents the luminophore from sticking to the casting mold if an emergence of melt through the lining were to nonetheless occur during the process. For applying the parting agent, the inside of the casting mold is coated with a suspension of fine-grained graphite, for example by spraying or brushing. By contrast to the lining, the parting layer does not become a constituent part of the protective cap or, respectively, of the crystal body connected thereto.

In an embodiment, the method of the present invention comprises the steps of providing a casting mold having an inside surface, lining the inside surface of the casting mold with a lining material, introducing a melt into the casting mold and on top of the lining, solidifying the melt to form a crystal body so that the crystal body is attached to the lining and removing the crystal body and lining from the casting mold whereby the lining, still attached to the crystal body, serves as a protective cap for the crystal body.

In an embodiment, the melt is further characterized as being a melt of a luminophore.

In an embodiment, the method further comprises the step of processing the crystal body to a scintillator plate.

In an embodiment, the crystal body comprises an outer surface that does not engage the lining or the casting mold and the method further comprises the steps of grinding the outer surface of the crystal body and attaching the outer surface to a glass plate thereby forming a scintillator plate.

In an embodiment, the step of attaching the crystal body to the glass plate comprises gluing the outer surface of the glass plate comprises gluing the outer surface of the crystal body to the glass plate with an optical gel.

In an embodiment, the lining further comprises a reflector material selected from the group consisting of a white pigment and a metal.

In an embodiment, the lining comprises a powdered material having a grain size of less than 1 $\mu$m.

In an embodiment, the lining is impervious to moisture.

In an embodiment, the lining comprises a foil.

In an embodiment, the lining step further comprises the steps of pre-shaping the lining outside of the casting mold, and fitting the lining into the inside surface of the casting mold.

In an embodiment, the lining comprises a material that is inert relative to the melt and said material is selected from the group consisting of graphite, silicate, and a precious metal.

In an embodiment, the lining comprises a plurality of layers.

In an embodiment, the method further comprises the step of applying a parking agent to the inside surface of the casting mold prior to the lining step.

In an embodiment, the method further comprises the steps of coating the outer surface of the crystal body with an anti-reflection coating and attaching the outer surface of the crystal body to a covering plate.

In an embodiment, the lining step further comprises coating the inside surface of the casting mold with a material used to fabricate the lining.

The present invention also provides a crystal body connected to a protective cap, the crystal body and protective cap being manufactured in accordance with the above-described methods.

The present invention also provides a scintillator plate which comprises a crystal body connected to a protective cap and a glass plate, the crystal body, protective cap and glass plate being manufactured in accordance with the above-described methods.

Other objects and advantages of the invention will become apparent upon reading the following detailed description and appended claims, and upon reference to the accompanying drawings.

BRIEF DESCRIPTION OF THE DRAWINGS

The invention is explained in greater detail below on the basis of exemplary embodiments and the drawings, wherein.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

A casting mold GF is manufactured of ceramic material, particularly of chamotte, for the manufacture of a scintillator plate of alkali halogenide for an Anger camera. Here, it has a rectangular crossection and a wall thickness that is sufficient for resisting the hydrostatic pressure of the alkali halogenide melt.

The inside wall of the casting mold GF is then provided with a positively fitted lining A. In the exemplary embodiment, this ensues by inserting a graphite foil having a thickness of 0.5 mm. The foil is folded such in the corners of the casting mold that the rectangular casting mold is lined at the floor and at the walls with the originally planar foil.

For manufacturing a crystal body, alkali halogenide melt S is now introduced into the casting mold GF provided with the lining A, potentially continuously. The crystal body KK is formed as a result of directed solidification, proceeding from the floor of the casting mold in the exemplary embodiment. When the melt S has completely solidified to form the crystal body KK and cooled, this is removed from the casting mold together with the lining A.

Figure 1:
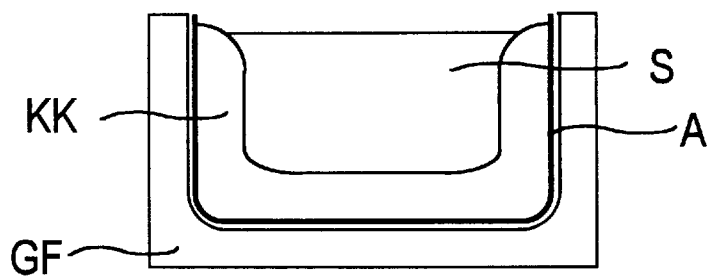
FIG. 1 is a schematic sectional view taken through a casting mold during the implementation of the method of the present invention.
Figure 2:
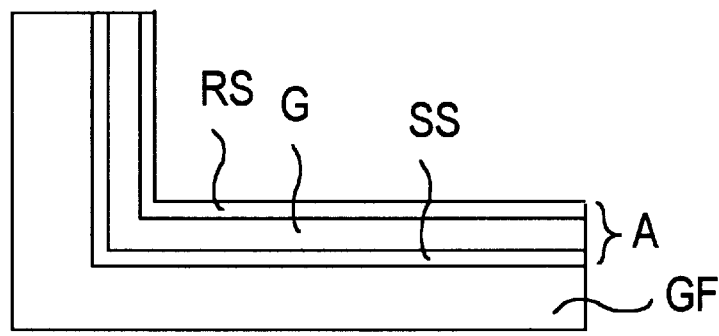
FIG. 2 is a partial sectional view of a casting mold with a multi-layer lining shown in FIG. 1.

FIG. 2 shows a casting mold with multi-layer lining. This comprises a protective layer SS as outermost layer, a 0.1 mm thick sheet steel here, a graphite foil G having a thickness of 0.5 mm and a reflector layer RS as innermost layer that contains fine-grained pigment particles with grain sizes below 1 $\mu$m. However, grain sizes up to a maximum of 10 $\mu$m are also possible.

Figure 3:
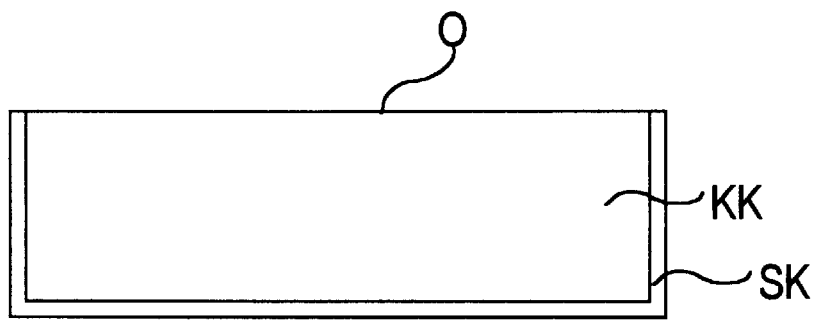
FIG. 3 is a schematic view of a crystal body with protective cap made in accordance with the present invention.
Figure 4:
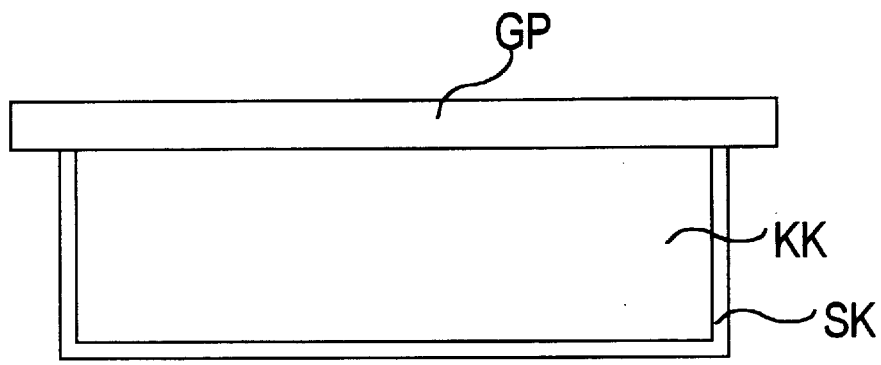
FIG. 4 is a schematic view of a scintillator plate made in accordance with the present invention.

The crystal body KK with the protective cap SK shown in FIG. 3 is obtained by introduction of melt, solidification to form a crystal body and removal of the latter together with the lining from the casting mold. The potentially multi-layer protective cap SK surrounds and protects the crystal body on all sides except the surface O, which is shown idealized as planar in FIG. 3. For further processing of the crystal body to form a scintillator plate, the surface O is ground and glued to a glass plate GP with an optical gel or the like. FIG. 4 shows the finished scintillator plate obtained in this way. The crystal body is protected by the protective cap during the processing and later during use.

Figure 5:
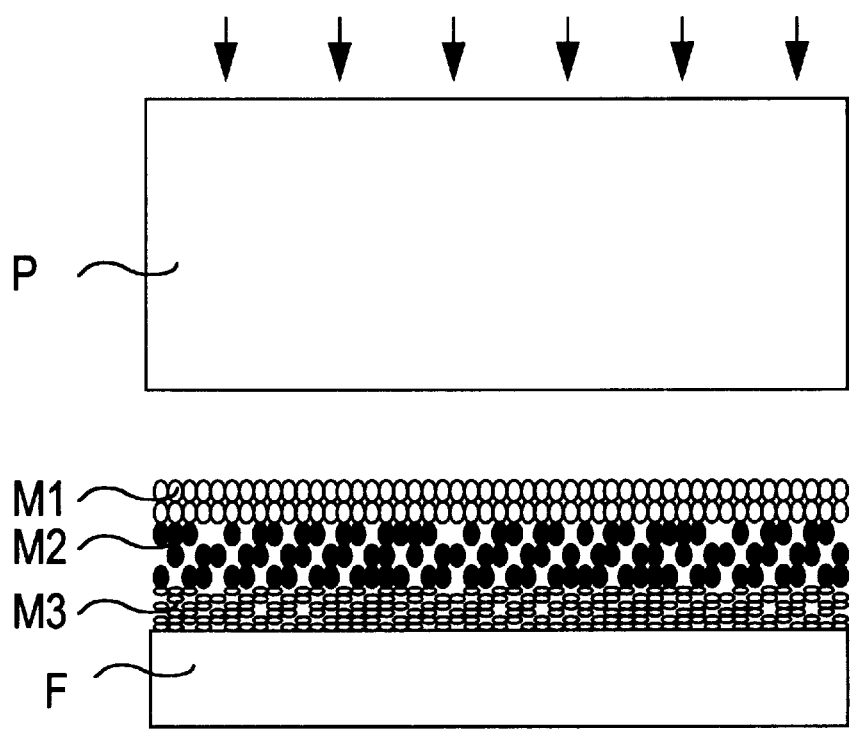
FIG. 5 is a schematic illustration of the method of the manufacture of a multi-layer lining in accordance with the present invention.

FIG. 5 shows one possibility for manufacturing a multi-layer lining A. To that end, the material M1, M2, M3 employed for the lining is introduced in flake form as a loose fill into a form F that can be the casting mold GF. The three layers shown here comprise material M1 for the protective layer, graphite flakes M2 and pigment powder M3. The loosely poured material for the lining A is compressed by uniaxial pressing with the assistance of a press die P under a potentially elevated temperature.

In an embodiment that is not shown, a multi-layer lining is produced by coating a solid material, whereby, for example, a metal foil serving as protective layer S is provided with a graphite layer by powder coating and subsequent compression and is provided with a pigment-containing reflector layer thereover.

With the inventive method, the number of process steps, the risk of breakage and, thus, the amount of waste and the manufacturing costs are lowered compared to conventional methods for the manufacture of crystal bodies. The sealing relative to a protective cap is eliminated in the further-processing of the crystal bodies to form scintillator plates. The time during which hygroscopic scintillator materials must dwell in dry rooms or protective atmospheres is shortened by reducing the process steps. The costs are reduced further as a result thereof.

The reflector layers can be closely adjacent to the crystal body, so that they can develop a better reflection effect than in traditional scintillators wherein a air gap is located between scintillator and protective cap. The tightly adjacent protective cap without air gap also impedes the lateral spread of moisture that can spread quickly over the entire surface via air gaps between crystal body and protective cap in traditional scintillators once a punctiform loss of tightness of the protective cap occurs. This lengthens the average service life of inventively manufactured scintillator plates compared to conventionally manufactured ones.

The invention is also suitable for the manufacture of other crystal bodies not composed of luminophores and, in particular, for materials that are especially sensitive to breakage or moisture and for which complicated casting molds were hitherto required.

From the above description it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

What is claimed:

1. A method of manufacturing a crystal body from a melt, comprising the steps of:

providing a casting mold, the casting mold having an inside surface;

lining the inside surface of the casting mold with a lining;

introducing a melt into the casting mold and on top of the lining;

solidifying the melt to form a crystal body so that the crystal body is attached to the lining; and removing the crystal body and lining from the casting mold whereby the lining serves as a protective cap for the crystal body.

2. The method of claim 1 wherein the melt is further characterized as being a melt of a luminophore.

3. The method of claim 2 further comprising the step of processing the crystal body to a scintillator plate and the protective cap serves as a functional component of the scintillator plate.

4. The method of claim 3 wherein the crystal body comprises an outer surface that does not engage the lining or the casting mold and the processing step further comprises grinding the outer surface of the crystal body; and attaching the outer surface to a glass plate.

5. The method of claim 4 wherein the attaching step comprises gluing the outer surface of the crystal body to a glass plate with an optical gel.

6. The method of claim 1 wherein the lining comprises a reflector material selected from the group consisting of a white pigment and a metal.

7. The method of claim 1 the lining comprises a powdered material having a grain size of less than 1 μm.

8. The method of claim 1 wherein the lining is impervious to moisture.

9. The method of claim 1 wherein the lining comprises a foil.

10. The method of claim 1 wherein the lining step further comprises pre-shaping the lining outside the casting mold; and fitting the lining onto the inside surface of the casting mold.

11. The method of claim 1 wherein the lining comprises a material that is inert relative to the melt, said material being selected from the group consisting of graphite, silicate and a precious metal.

12. The method of claim 1 wherein the lining comprises a plurality of layers.

13. The method of claim 1 further comprising the following step after the providing step and prior to the lining step:

applying a parting agent to the inside surface of the casting mold.

14. The method of claim 1 wherein the crystal body comprises an outer surface that does not engage the lining or the casting mold and wherein the method further comprises the steps of:

coating the outer surface of the crystal body with an anti-reflection coating; and attaching the outer surface of the crystal body to a covering plate.

15. The method of claim 1 wherein the lining step further comprises coating the inside surface of the casting mold with a material used to fabricate the lining.

16. A method of manufacturing a crystal body from a melt, comprising the steps of:

providing a casting mold, the casting mold having an inside surface;

lining the inside surface of the casting mold with a lining;

introducing a melt into the casting mold and on top of the lining;

solidifying the melt to form a crystal body so that the crystal body is attached to the lining;

removing the crystal body and lining from the casting mold;

grinding the outer surface of the crystal body; and attaching the outer surface of the crystal body to a glass plate whereby the protective cap serves as a functional component of the scintillator plate.

17. The method of claim 16 wherein the attaching step comprises gluing the outer surface of the crystal body to a glass plate with an optical gel.

18. The method of claim 16 wherein the lining step further comprises pre-shaping the lining outside the casting mold; and fitting the lining onto the inside surface of the casting mold.

19. A crystal body assembly comprising:

a prism shaped crystal comprising a top side and a plurality of other sides, the plurality of other sides being continuously covered and connected to a protective cap, the top side being uncovered, the protective cap comprising an inner layer, an outer layer and a middle layer disposed between the inner and outer layers, the inner layer continuously covering and being connected to the other sides of the crystal.

20. The crystal body assembly of claim 19 wherein the inner layer comprises a powdered material having a grain size of less than 1 μm.

21. The crystal body assembly of claim 20 wherein the middle layer comprises a graphite foil.

22. The crystal body assembly of claim 21 wherein the outer layer comprises sheet steel.

23. The crystal body assembly of claim 19 wherein the top side is connected to a glass plate.

* * * * *